(12) United States Patent
Albsmeier et al.

(10) Patent No.: US 8,994,374 B2
(45) Date of Patent: Mar. 31, 2015

(54) LOCAL COIL SYSTEM, MAGNETIC RESONANCE SYSTEM AND METHOD FOR TRANSMITTING SIGNALS FROM A LOCAL COIL

(75) Inventors: Andre Albsmeier, München (DE); Jan Bollenbeck, Eggolsheim (DE); Klaus Pistor, Neubiberg (DE); Florian Poprawa, München (DE); Stefan Schwarzer, Taufkirchen (DE); Markus Vester, Nürnberg (DE); Thomas Wuchenauer, Elchingen (DE)

(73) Assignee: Siemens Aktiengesellschaft, München (DE)

( * ) Notice: Subject to any disclaimer, the term of this patent is extended or adjusted under 35 U.S.C. 154(b) by 411 days.

(21) Appl. No.: 13/432,437

(22) Filed: Mar. 28, 2012

(65) Prior Publication Data
US 2012/0249140 A1    Oct. 4, 2012

(30) Foreign Application Priority Data
Mar. 31, 2011  (DE) .................. 10 2011 006 509

(51) Int. Cl.
G01V 3/00 (2006.01)
G01R 33/36 (2006.01)
G01R 33/3415 (2006.01)

(52) U.S. Cl.
CPC ........ G01R 33/3692 (2013.01); *G01R 33/3415* (2013.01); *G01R 33/3621* (2013.01)
USPC .......................................... 324/322; 324/318

(58) Field of Classification Search
CPC .................................................. G01R 33/3692
USPC ................................. 324/322, 318, 314, 300
See application file for complete search history.

(56) References Cited

U.S. PATENT DOCUMENTS

| 6,297,637 | B1 | 10/2001 | Feld et al. |
| 6,339,717 | B1 | 1/2002 | Baumgartl et al. |
| 7,333,727 | B2 * | 2/2008 | Fez et al. .......................... 398/78 |
| 7,417,433 | B2 | 8/2008 | Heid et al. |
| 8,049,500 | B2 * | 11/2011 | Griswold et al. .............. 324/318 |
| 2007/0182409 | A1 | 8/2007 | Varjo |
| 2009/0140739 | A1 | 6/2009 | Bennett |
| 2010/0117643 | A1 | 5/2010 | Hulbert |
| 2010/0259261 | A1 | 10/2010 | Saes et al. |
| 2010/0308826 | A1 | 12/2010 | Saes et al. |
| 2012/0075126 | A1 | 3/2012 | Baumgartl et al. |

FOREIGN PATENT DOCUMENTS

DE          199 11 988 A1    9/2000
DE    10 2005 022 551 A1    11/2006

(Continued)

OTHER PUBLICATIONS

German Office Action dated Nov. 11, 2011 for corresponding German Patent Application No. DE 10 2011 006 509.1 with English translation.

(Continued)

*Primary Examiner* — Louis Arana
(74) *Attorney, Agent, or Firm* — Lempia Summerfield Katz LLC

(57) ABSTRACT

A local coil system for a magnetic resonance system has a local coil for detecting MR response signals and a transmitter for wirelessly transmitting signals to the magnetic resonance system. At least one pseudo random device is operable to change signals in a pseudo random fashion in order to avoid interferences in the imaging.

18 Claims, 3 Drawing Sheets

(56) References Cited

FOREIGN PATENT DOCUMENTS

| | | |
|---|---|---|
| DE | 10 2007 056 223 A1 | 5/2009 |
| DE | 10 2010 013 683 A1 | 10/2011 |
| WO | WO 2008/155703 A1 | 12/2008 |
| WO | WO 2009/081378 A1 | 7/2009 |

OTHER PUBLICATIONS

Arnulf Oppelt, "Imaging Systems for Medical Diagnostics: Fundamentals, Technical Solutions and Applications for Systems Applying Ionizing Radiation, Nuclear Magnetic Resonance and Ultrasound," John Wiley & Sons, 2005, pp. 540-599.

\* cited by examiner

LOCAL COIL SYSTEM, MAGNETIC RESONANCE SYSTEM AND METHOD FOR TRANSMITTING SIGNALS FROM A LOCAL COIL

This application claims the benefit of DE 10 2011 006 509.1, filed Mar. 31, 2011.

BACKGROUND

The present embodiments relate to a local coil system and a magnetic resonance (MR) system with reduced interference signals.

In a magnetic resonance system for creating a tomograph, a patient is positioned on a couch in a cylindrical measuring space. A strong magnetic field prevails in cylindrical space. On account of the activation of a gradient coil, the magnetic field includes a gradient. The nuclear spin of atoms is adjusted through the magnetic field. A transmitting antenna arrangement, generally a whole body transmitting antenna arrangement (e.g., a birdcage antenna), is disposed within cylindrical space in order to output magnetic resonance high frequency pulses so as to excite the atoms.

During a magnetic resonance examination, local coils are generally used to receive the magnetic resonance response signals during relaxation of the nuclear spin. Different materials exhibit different relaxation behavior, so that conclusions may be drawn as to the interior of the body of the patient on account of the relaxation behavior. These local coils are receiving antenna modules, which comprise at least one or more receiving antenna elements, generally in the form of conductor loops. The received MR response signals are generally preamplified in the local coil and routed out of the central region of the magnetic resonance system by way of cables to a screened receiver of an MR signal processing facility. The received data is then digitalized and further processed. With many examinations, a plurality of such local coils is already arranged on the patient in order to cover whole areas of the body of the patient.

The mode of operation of magnetic resonance systems is known to the person skilled in the art and described for instance in Imaging Systems for Medical Diagnostics, Arnulf Oppelt, Publicis Corporate Publishing, ISBN 3-89578-226-2.

The local coils are frequently arranged in a so-called local coil mat, which is placed above or below the patient body. In addition, specially molded local coil systems, such as head coils, neck coils or others exist. The signals are currently routed from the local coils to an evaluation facility of the magnetic resonance system by cables. The cables are undesirable since cables cannot be easily routed from the patient couch to the evaluation facility, are perceived as bothersome by personnel since the patient couch is moved with the patient and the local coil mat and the cables are consequently loosely routed.

Approaches for the wireless digital transmission of signals between the local coils and the magnetic resonance system are known. Nevertheless, in this case, electronic components are located in the high frequency field of the body coil. For example, analog-to-digital converters, FPGA, processors, modulators are in the field. These components must prevent any emission of signal parts into frequency ranges falling in the Larmor frequency range of the magnetic resonance system. In addition to the interference signals generated directly in the Larmor frequency range, intermodulation products of several interference signals, which do not lie individually in the Lamor frequency range, may have intermodulation products that are in the Lamor frequency range.

SUMMARY AND DESCRIPTION

A local coil system, a magnetic resonance system and a transmission method, which enable a wireless transmission between the local coil system and the magnetic resonance system with reduced interference in the MR imaging is provided.

The local coil system for a magnetic resonance system includes at least one local coil for detecting MR response signals and at least one transmitter or device for transmitting signals. The local coil system includes at least one pseudo random device, which is embodied to change signals in a pseudo random fashion. The pseudo random device may be embodied in particular to temporally delay signals in a pseudo random fashion and/or to change the signal information in a pseudo random fashion.

As a result, regularly recurring signal sequences which interfere with the imaging may be avoided. In particular, signal parts in frequency ranges which lie in the Larmor frequency range of the magnetic resonance system may be avoided. Periodic events, for instance regularly recurring training sequences or frame start markers are included here in particular. Their periods do not correlate directly with the Larmor frequency. Couplings in low frequency segments, for instance the front end, are nevertheless possible. Couplings of this type may result in point disturbances or line disturbances in the magnetic resonance image, which renders an imaging of this type unusable. The disturbances are prevented by the pseudo random change in the signals.

Analog circuits and digital circuits, which are not used for data transmission and which are located within the examination space of the magnetic resonance system and the local coil system, are designed so that all generated signals, for instance high frequency oscillations for mixed processes and digital clocks, are generated by coherent, whole-number frequency division or frequency multiplication of a clock signal which is coherent with the other periodic processes in the magnetic resonance system. In this way, newly generated signals, which are generated by circuits within the examination space, fall on a multiple of a basic clock rate known in the system. The basic clock rate is selected such that no signal parts, particularly also no harmonic waves and intermodulation products, are produced at the Larmor frequency. With a magnetic field of 3T, the Larmor frequency amounts to approximately 123.2 MHz. The shared basic clock rate may be selected for instance such that the scanning frequency of the ADC is identical thereto or is a whole number multiple thereof, local oscillators which are used for frequency conversion are whole number multiples thereof, and none of the multiples lie in a Larmor frequency range of a type of atom to be received.

The basic clock rate may then amount for instance to 2.5 MHz with a magnetic field of 1.5 T or 3 T.

Additionally, with the wireless digital signal transmission, further periodic processes occur at the physical interfaces. These periodic processes may not occur on a multiple of the mentioned basic clock rate. Regularly recurring signal sequences, which may be regarded as interfering periodically recurring signals, include, for example, internal voltage level in the FPGA, the highest value bit 0 or 1 of which flips with the NCO frequency. The voltage levels are however relatively low (e.g. 1.0 V and below). Nevertheless, this low level may even be problematic since the MRT is a very sensitive measuring device.

Furthermore regularly recurring signals appear which are inserted into the data stream for digital transmission of the data. For instance, constant training sequences are inserted into the digital data stream at the start of a frame for estimating the channel pulse response and for the receiver-side distortion. The digital data stream is for transmitting the MR response signal. Frame start markers (i.e. codes with good autocorrelation properties) usually exist on a wireless digital signal transmission path in order to be able to temporally locate the frame and to determine the start and/or end of a frame. Furthermore, constant meta information, such as header information, may also be contained in the digital data stream. The information may define the structure of the signal current. Meta information of this type may be, for instance, the number of the local coil from which the received signals are transmitted.

The pseudo random device may vary these signals in a pseudo random fashion so that the periodicity is omitted and interference in the imaging and the image recording is reduced.

A magnetic resonance system includes the local coil system, a receiver, which receives signals received from the transmitter, and a descrambler device, which decodes the received signal.

With a method for transmitting signals, which represent MR response signals, from a transmitter of a local coil of a magnetic resonance system to a receiver of the magnetic resonance system, the signals are accordingly changed in a pseudo random fashion prior to transmission and decoded again following the transmission.

The local coil system may include a modulator. The modulator modulates an unmodulated signal into a modulated signal. The transmitter transmits a modulated signal wirelessly to a receiver of a magnetic resonance system. The pseudo random device includes a first scrambler or is formed by the same. The scrambler encodes the unmodulated signal before modulation by a modulator. The modulator may be any digital modulator, which outputs a high frequency signal to an antenna. The digital modulator may, for example, use a quadrature amplitude modulation or a phase shift keying.

The digitally scanned MR signal, which is to be transmitted, and the meta information are subsequently converted into a pseudo random binary sequence upstream of the modulator. This process is also referred to as scrambling. The structure of a scrambler is known to the person skilled in the art. A scrambler may for instance be structured as a linearly regenerating shift register. The digital data stream is encoded with a code word by the scrambler.

Periodic processes relating to recurring bit patterns are subsequently effectively suppressed. The pseudo random bit sequence may be generated, for example, using a linearly regenerated shift register. The register has a comparably long period. In order to suppress interferences in a more efficient fashion during image generation, other random sequence generation facilities may also be used. For example, a so-called Mersenne twister, which has very long period which may be interpreted as infinite from the point of view of the system, may be used.

As mentioned above, the data stream in the receiver in the magnetic resonance system is decoded following demodulation. To this end, a so-called sync word may be used in one example.

The local coil system may include an analog-to-digital converter, which converts the MR response signal detected by the local coil into a digital signal. The analog-to-digital converter may include a second scrambler, which includes a pseudo random facility or forms the same. The second scrambler encodes the digitalized signal before output by the analog-to-digital converter. The second scrambler may be on the same chip as the analog-to-digital converter. The second scrambler and the analog-to-digital converter may be located in the same housing. As a result, periodically occurring digital signals are avoided from the start. The second scrambler may be coupled directly to the analog-to-digital converter, for example. The second scrambler may, however, similarly be integrated with the analog-to-digital converter. The MR response signal may be amplified by an analog amplifier before conversion into a digital signal by the analog-to-digital converter.

The digital signal is converted into a pseudo random signal, before the digital signal is further processed by another component, such as a FPGA.

The pseudo random device may be coupled to a channel estimation device or to a frame start code generation device. The pseudo random device may be set up to instruct the channel estimation device and/or the frame start code generation device to output alternating training sequences, correlation sequences, channel estimation signals and/or frame start codes. Alternatively or in addition, the pseudo random device may be set up to instruct the channel estimation device and/or the frame start code generation device to output training sequences, correlation sequences, channel estimation signals and/or frame start codes at pseudo random points in time.

The local coil system uses alternating training sequences and correlation sequences for the channel estimation and frame start marker and/or frame start identifier. The training sequences and correlation sequences may be generated in a pseudo random fashion or selected in a pseudo random fashion from a predetermined set of training sequences and correlation sequences.

The respectively used training sequence and/or correlation sequence is known to the receiver and/or to the descrambler. To this end, the receiver and/or the descrambler may also include a pseudo random device. The pseudo random device generates the same pseudo random training sequences, correlation sequences, channel estimation signals and/or frame start codes. Furthermore, the local coil system may convey an item of information to the receiver relating to the points in time at which the training sequences, correlation sequences, channel estimation signals and/or frame start codes are received. For example, the transmitter-side pseudo random device may generate a code, which is transmitted to the receiver-side pseudo random device. The receiver-side pseudo random facility determines how the received signal is to be decoded, and in particular determines which training sequence, which correlation sequence, which channel estimation signal, and/or which frame code is to be received. Furthermore, the transmitter-side pseudo random facility may transmit a code, which informs the receiver-side pseudo random facility about the pseudo random point in time at which the next signal (e.g., the next training sequence, the next correlation sequence, the next channel estimation signal and/or the next frame start code) is transmitted.

The time frames reserved on a channel for training sequences and frame start sequences may not necessarily be provided prior to each frame. Instead, the training sequences and frame start sequences may be used in a pseudo random fashion prior to a frame. The training and frame start sequences may be provided sporadically, partially left out or used in multiples for a frame. The periodicity may in this way also be prevented even with constant training sequences. The frame rate may be determined on a multiple of the afore-cited MR basic clock rate.

The transmitter may include a carrier frequency generator. The carrier frequency generator is coupled to the pseudo random device such that the pseudo random device varies the carrier frequency of the carrier frequency generator in a pseudo random fashion and/or the carrier frequency is changed in a pseudo random fashion. A signal spreading is herewith achieved by a pseudo random sequence of carrier signals. In order to vary the carrier signal, a voltage-controlled oscillator (VCO) may be used. The receiver in the magnetic resonance system may have a comparably large bandwidth, so that the receiver may receive all the signals transmitted by the local coil system. It is also possible to store an item of information in the transmitted data stream. The item indicates at which point in time which frequency is used for transmitting purposes. This information may be evaluated on the receiver side in order to receive the signals with the corresponding carrier frequency.

The pseudo random device, the first scrambler device and/or the second scrambler device may include a self-synchronizing scrambler and/or form such. These scramblers are also referred to as multiplicative scramblers. With a self-synchronizing scrambler, no external synchronization mechanisms and synchronization words are needed. The system may therefore also not work without clock and/or synchronization.

Accordingly, the descrambler of the receiver of the magnetic resonance system decodes a signal, which is encoded with a self-synchronizing scrambler. The descrambler may be a self-synchronizing and/or multiplicative descrambler.

The pseudo random device may be a grey counter. Counters of this type are characterized in that when adding or subtracting the value "1," only one bit changes state more or less randomly. As a result, all bits of the counter change their state in a phase-shifted fashion with the same clock. The clock may be selected such that the clock is a whole number multiple of the MR basic clock.

It is also possible to use a pseudo random number generator with a fixed word length as a counter. It is possible to assign each random number, which is determined once, to a determined numerical value or counter value. This determined assignment may be stored in a table.

The local coil system may comprise a delay, which delays at least one control signal. The delay is activated by the pseudo random device in order to delay at least one control signal and/or clock signal in a pseudo random fashion. Low frequency, periodically occurring control signals may subsequently be delayed in a pseudo random fashion with each occurrence by a few cycles in order to avoid a periodicity. This embodiment is particularly advantageous if a plurality of control signals are clocked in order to clock the data processing in the local coil system with a pseudo random delay and/or a pseudo random jitter. The data is subsequently processed by the digital circuitry in the local coil system in an irregular temporal sequence, as a result of which the periodicity is avoided or at least significantly attenuated. The expression control signals also includes clock signals.

The local coil system may include a space generation device, which generates spaces in a data stream and which is activated by the pseudo random device in order to generate pseudo random spaces in the data stream. The bit rate on the digital transmission channel from the local coil system to the magnetic resonance system may be selected such that the rate is a whole-number multiple of the MR basic clock (e.g., the rate is a whole-number multiple of 2.5 MHz). The bit rate of the digital transmission channel between the local coil system and the magnetic resonance system is also selected such that the rate is higher than the minimal required bit rate for transmitting the expected local coil signals. If the bit rate on the transmission channel from the local coil system to the magnetic resonance system is higher than necessary, the data stream transmitted on this channel may include spaces. Using the space generation device, the spaces in the data stream are, as described above, temporally arranged in a pseudo random fashion and thus a periodicity of the spaces and a periodicity outside of the grid of the MR basic clock is avoided.

DETAILED DESCRIPTION OF THE DRAWINGS

Figure 1:
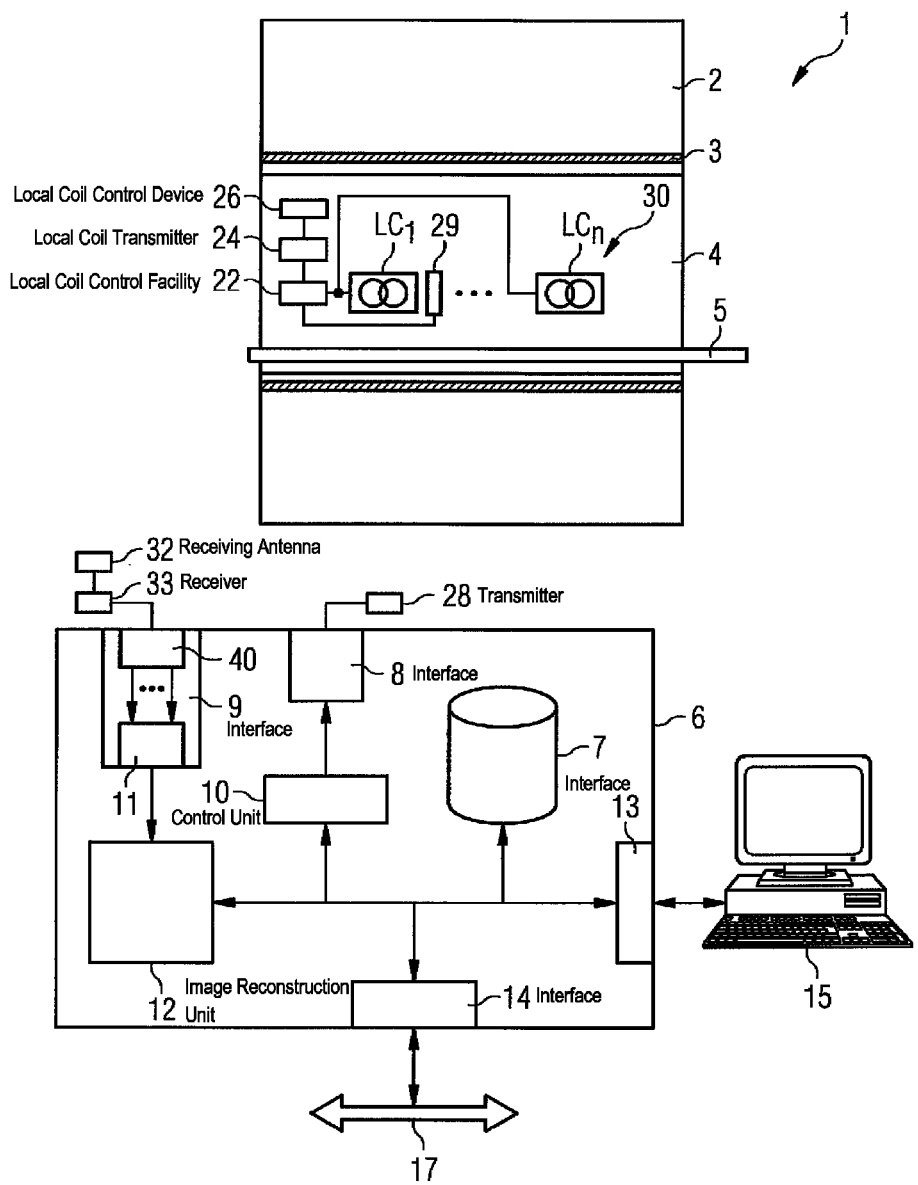
FIG. 1 shows a schematic representation of an example embodiment of a tomography system having a MR receiving system.

FIG. 1 shows a basic block diagram of a magnetic resonance system 1. The magnetic resonance system 1 includes a tomograph 2, also known as scanner, in which a patient (not shown) is positioned on a couch 5 in a cylindrical measuring space 4. A whole body transmitting antenna arrangement 3, for instance a birdcage antenna, is found within the tomograph 2. The whole body transmitting antenna arrangement 3 emits the magnetic resonance high frequency pulses.

In the exemplary embodiments according to FIG. 1, the MR receiving system 20 includes a local coil arrangement 30 with a number of local coils $LC_1, \ldots, LC_n$ and a transmission signal receiving module 40. The local coil arrangement 30 is arranged, as shown in FIG. 1, in a measuring space 4 of a tomograph 2 and/or scanner of the magnetic resonance system 1. The transmission signal receiving module 40 is localized in an associated control device 6 of the magnetic resonance system 1.

Part of this control device 6 is also the MR signal processing facility. Reference is expressly made at this point however to the system being arbitrarily scalable. Any number of physical inputs of the MR signal processing facility 11 may be operated with a corresponding embodiment of the MR receiving system 20.

The tomograph 2 is activated by the control device 6. A terminal 15 (and/or operator console) is connected to the control device 6 via a terminal interface 13 by way of which an operator may operate the control device and thus the tomographs 2. The control device 6 is connected to the tomograph 2 by a tomograph control interface 8 and an image acquisition interface 9. Suitable control commands are output to the tomograph 2 by way of the tomograph control interface 8 via a sequence control unit 10 based on scan protocols. To generate the desired magnetic fields, the desired pulse sequences (i.e., the high frequency pulse and the gradient pulse) are emitted for the gradient coils (not shown) in order to. Raw data is acquired by way of the image data acquisition interface 9, such as reading out the received MR response signals. The control facility 6 also includes a mass storage device 7, in which generated image data may be stored for instance and measuring protocols may be saved.

A further interface 14 is used for connection to a communication network 17, which is connected for instance to an image communication system (PACS, Picture Archiving and Communication System) or offers connection possibilities for external data storage.

Both the control device 6 and also the terminal 15 may also be integral parts of the tomograph 2. The entire magnetic resonance system 1 furthermore also may include further conventional components and/or features, which are however not shown in FIG. 1 for the sake of clarity.

A local coil arrangement 30 with a number of local coils $LC_1, \ldots, LC_n$ is found in the scanner 2 for the purpose of receiving the magnetic resonance signals. The local coils LC in turn are connected to the transmission signal receiving module 40 of the image acquisition interface 9 by the wireless interface. The received signals are further processed in the MR signal processing facility 11 and then fed to an image reconstruction unit 12, which reconstructs the desired magnetic resonance images there from in a conventional fashion. The images may be stored for instance in the memory 7 or at least partially output on the operator terminal 15 or conveyed to other components, such as the diagnosis station or mass storage device via the network 17.

An energy/instruction transmitter 28 is connected to the tomograph control interface 8. The energy/instruction transmitter 28 wirelessly transmits energy and instructions to the local coils $LC_1, \ldots, LC_n$. The local coil arrangement $LC_1 \ldots LC_n$ includes an energy/instruction receiving device 29, which receives the wirelessly transmitted energy and the wirelessly transmitted instructions. The energy and instructions are routed to the local coil control facility 22. The local coil control device 22 supplies the local coils $LC_1, \ldots, LC_n$ with energy and activates the same. MR signals received by the local coils are fed to the local coil transmitter 24 from the local coil control device 26. The local coil transmitter 24 transmits via a local coil transmitting antenna 26 to a receiving antenna 32. The signals received by the receiving antenna 32 are preprocessed by a receiver 33 and fed to the transmission signal receiving module 40.

Figure 2:
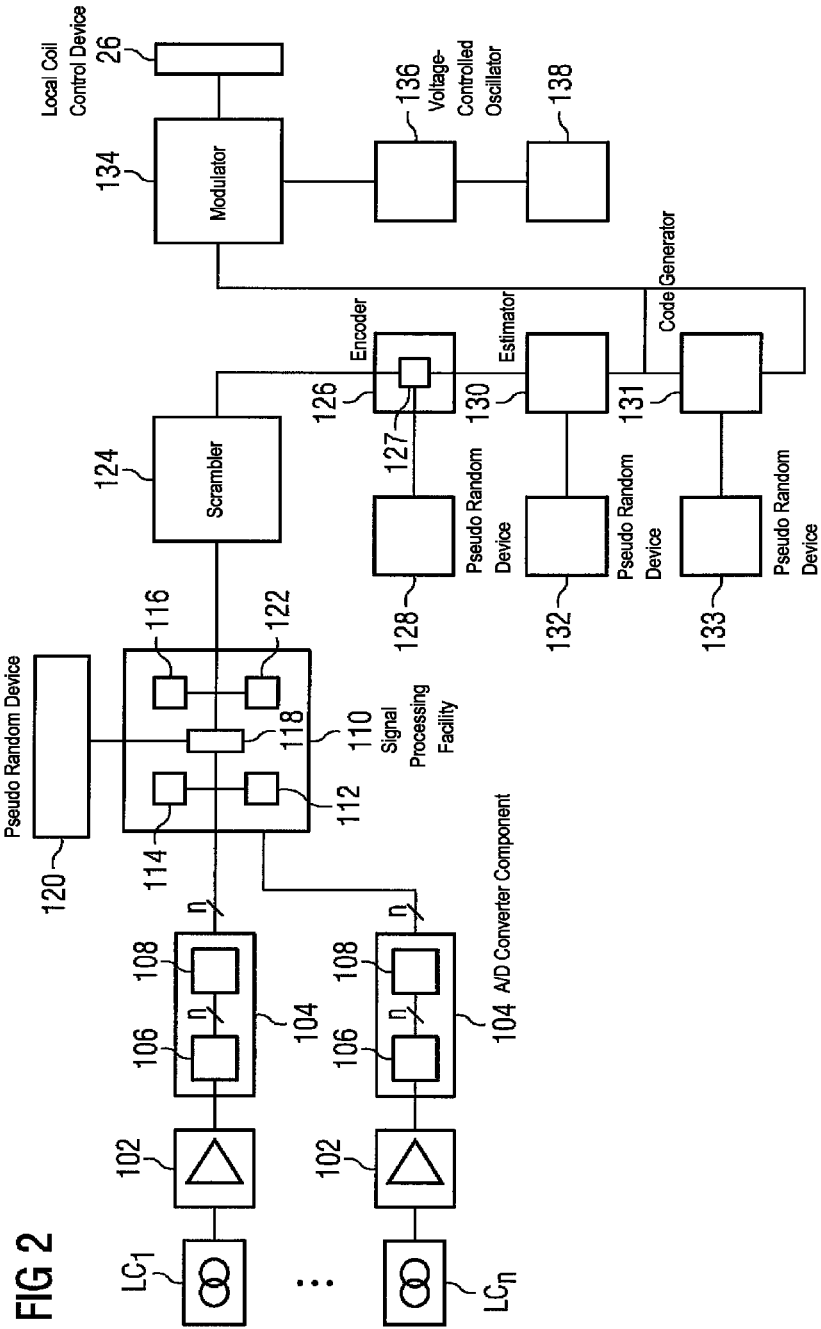
FIG. 2 shows a block diagram of one embodiment of a circuit arrangement for a local coil system.

Reference is now made to FIG. 2, which indicates a circuit arrangement 100 for the wireless transmission of an MR response signal acquired by a local coil $LC_1, \ldots, LC_n$. Individual components of the circuit arrangement 100 may be distributed arbitrarily on discrete components and may be embodied as an integrated circuit or by a plurality of integrated circuits.

The signals output by the local coil $LC_1, \ldots, LC_n$ may be amplified in an amplifier 102, before being fed to an analog-to-digital converter component 104. The analog-to-digital converter component 104 includes an analog-to-digital converter 106, which converts the analog signal from the local coil into a digital signal. A scrambler 108 is connected to the analog-to-digital converter 106. The scrambler 108 encodes the digital signal from the analog-to-digital converter 106 into a pseudo random sequence. The first scrambler 108 is a self-synchronizing and/or multiplicative scrambler. Each local coil $LC_1, \ldots, LC_n$ may be assigned to an optional amplifier 102 and to an analog-to-digital component 104.

Since the signal output by the analog-to-digital converter component 104 is converted into a pseudo random sequence by the first scrambler 108, any periodicity that could interfere with the imaging is avoided.

The digital signal is fed to a signal processing facility 110, which includes digital components 112, 114, a clock generator 118, a delay 118 and a grey counter 122. The digital components 112, 114 process the digital signal. The digital components 112, 114 may be implemented, for example, by an FPGA respectively. The clock generator 116 may pre-specify a control clock, which controls the mode of operation of the digital components 112, 114 and of the grey counter 122. The delay 118 delays these control signals, for instance clock signals generated by the clock generation facility, in a pseudo random fashion. The measure of the pseudo random delay of the control signals is generated by a first pseudo random device 120, which is coupled to the delay 118. The first pseudo random device 120 may, contrary to what is shown, also be found within the signal processor 110. Since the control signals, for instance the clock signals, are delayed in a pseudo random fashion, periodic interferences are avoided by the control signals and the interferences resulting there from by periodic changes in the data signals, for instance the content of registers, is prevented. The clock generator 116 generates a clock signal with a frequency that is a whole-number multiple of the basic clock of the magnetic resonance system. The clock of the magnetic resonance system may be 2.5 MHz for instance. The clock generator 116 may provide the components of the circuit arrangement with control signals and/or clock signals. The delay 118 may delay the control signals and/or clock signals for some or all of the components of the circuit arrangement 100.

Since the clock signals are a whole number multiple of the MR basic clock, interferences in imaging on account of the clock signals and/or control signals are avoided.

The signal output by the signal processing facility 110 is fed into a second scrambler 124, which converts the fed-in signal into a pseudo random sequence. The second scrambler 124 is a self-synchronizing scrambler, such as a multiplicative scrambler, which need not be synchronized with a receiver-side scrambler so that the original signal may be reproduced.

A scrambler can therefore be structured by a linearly regenerated shift register. The structure of a scrambler is however known to the person skilled in the art and is therefore not explained in more detail here.

As mentioned previously, a bit rate which is a multiple of the MR basic clock is to be used to transmit the digital signals output by the second scrambler 124. This clock may, as likewise mentioned above, be generated by a shared clock source, such as the clock generator 116, and used coherently by the components of the circuit arrangement 100. This clock is however unsuitable as a frame rate, in order to use forward correction methods. The source bit rate of an MR signal may amount to 120 MHz (48 times the multiple of 2.5 MHz). The bit rate on the transmission channel between the local coil transmitting antenna 26 and the receiving antenna 32 may amount for instance to 160 MHz (64 times the multiple of 2.5 MHz). With a quadrivalent modulation (for instance 4-QAM), the symbol rate amounts consequently to 80 MHz (32 times the multiple of 2.5 MHz). In an encoder 126, the bit rate of the MR signal is therefore adjusted from 120 MHz to the bit rate of the transmission channel of 160 MHz. To this end, spaces are to be inserted into the data stream transmitted by the digital transmission channel. These spaces are generated in a pseudo random fashion by the space generator 127. The space generator 127 is coupled to a second pseudo random device 128, which specifies the point in time and/or duration of the spaces.

The encodor 126 may use a Reed-Soloman code. A symbol rate of 20 MHz (8 times the multiple of 2.5 MHz) is subsequently produced. The Reed-Soloman code may be set up such that the code produces spaces in the data stream, which is wirelessly transmitted via the digital channel. This point in time and/or the duration of the spaces may vary in a pseudo random fashion as mentioned. These measures also avoid interferences in the imaging on account of periodicities.

The digital signal current is then fed into a channel estimator 130. The channel estimator 130 generates signal sequences, training sequences and/or correlation sequences, with which the digital channel between the local coil transmitter 24 and the receiver may be estimated. These signals are usually output periodically. The channel estimator 130 is coupled to a third pseudo random device 132, which instructs the channel estimator 130 to randomly select a signal sequence, training sequence and/or correlation sequence to estimate the channel. Furthermore, the third pseudo random device 132 instructs the channel estimator 130 to output the signal sequences, training sequences and/or correlation sequences at pseudo random points in time. This embodiment enables periodically occurring signals to be avoided. Consequently, the imaging is not disturbed by periodically occurring signals.

A frame start code generator 131, which is coupled to a fourth pseudo random device 133, is also found in the signal flow. The frame start code generation facility inserts a start marker prior to each frame or after a predetermined number of frames so that the receiver may identify that a new frame and/or a new frame series is received. The fourth pseudo random device 133 controls the frame start code generator 131 so that different frame start codes are output in a pseudo random fashion and/or the frame start codes are output at pseudo random points in time. This embodiment also avoids a possible periodicity of signals, as a result of which interference of the imaging can be avoided.

The signal current is finally fed into a modulator 145, which generates a high frequency signal sent by the local coil transmitting antenna 26 to the receiver 33. The modulator 134 is coupled to a voltage-controlled oscillator (VCO) 136, which outputs a high frequency signal as a function of a voltage. The high frequency signal output by the voltage-controlled oscillator 136 is used as a carrier signal. The voltage-controlled oscillator 136 is coupled to a fifth pseudo random device 139, which outputs pseudo random voltage values to the voltage-controlled oscillator 136. The voltage-controlled oscillator 136 outputs high frequency signals with a pseudo random frequency. The carrier frequency of the modulator 134 therefore fluctuates in a pseudo random fashion since the modulator 134 is fed with a pseudo random high frequency. A periodicity which can interfere with the imaging, may also be avoided by this signal spreading.

Figure 3:
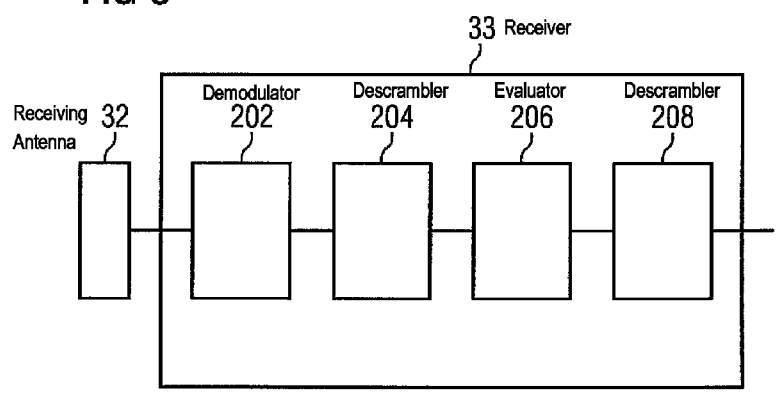
FIG. 3 shows a block diagram of one embodiment of a receiver of a magnetic resonance system.

FIG. 3 shows a receiver 33 for a tomography system. The receiver 33 may receive and decode the signal encoded by the circuit arrangement 100. The receiver 33 is coupled to a receiving antenna 32, which receives a digital high frequency signal. The digital high frequency signal is converted into a low frequency digital signal in a demodulator 202. The signal is decoded in a first descrambler 204. In an evaluation device 206 coupled to the first descrambler 204, meta information and all information for wirelessly transmitting the signal is removed. A second descrambler 208 again generates the original digital values, which were encoded by the first scrambler 108. Consequently, the original MR response signal information may be reproduced, although the signal was prepared in the local coil arrangement 100 such that periodically recurring signals are largely avoided. The first descrambler 204 and the second descrambler 208 may be self-synchronizing descramblers.

As the example presented shows, a local coil system and a magnetic resonance system are created. The received MR signals are wirelessly transmitted from the local coil system to the magnetic resonance system, whereby the local coil system is set up such that periodic signal sequences are avoided so that interference in the imaging is prevented.

Reference is subsequently made once again to the previously described detailed method and structures being exemplary embodiments and the basic principle also being variable by the person skilled in the art within a wide variety of fields without departing from the scope of the invention. For the sake of completeness, reference is also made here to the use of the indefinite article "one" not excluding the possibility of the relevant features also being present in multiples. The term "unit" is likewise not excluded, such that this consists of several components which can if necessary also be distributed spatially.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil system for a magnetic resonance (MR) system, the local coil system comprising:
a local coil for detecting MR response signals;
at least one pseudo random device operable to change signals representing the detected MR response signals in a pseudo random fashion; and
a transmitter operable for transmitting signals based on the changed signals,
wherein the at least one pseudo random device is configured for chronologically delaying the signals representing the detected MR response signals pseudo-randomly.

2. The local coil system as claimed in claim 1, wherein the pseudo random device is operable to change the signal information in a pseudo random fashion.

3. The local coil system as claimed in claim 1, further comprising a modulator operable to modulate an unmodulated signal into a modulated signal, where the transmitter transmits the modulated signal wirelessly to a receiver of the magnetic resonance system, and the pseudo random device includes a first scrambler operable to encode the unmodulated signal before being modulated by the modulator.

4. The local coil system as claimed in claim 1, further comprising an analog-to-digital converter operable to convert the MR response signals detected by the local coil into a digital signal, where the analog-to-digital converter comprises a second scrambler operable to pseudo randomly encode the digital signal before output by the analog-to-digital converter.

5. The local coil system as claimed in claim 1, wherein the pseudo random device is coupled to a channel estimator, to a frame start code generator, or to a combination thereof, and wherein the pseudo random device instructs the channel estimator, the frame start code generator or the combination thereof to output changing training sequences, correlation sequences, channel estimation signals, frame start codes or combinations thereof.

6. The local coil system as claimed in claim 1, wherein the pseudo random device is coupled to a channel estimator, to a frame start code generator, or to a combination thereof, and wherein the pseudo random device instructs the channel estimator, the frame start code generator, or the combination thereof to output the training sequences, correlation sequences, channel estimation signals, frame start codes, or combinations thereof at pseudo random points in time.

7. The local coil system as claimed in claim 1, wherein the transmitter comprises a carrier frequency generator coupled to the pseudo random device such that the pseudo random device varies a carrier frequency of a carrier frequency generator in a pseudo random fashion.

8. The local coil system as claimed in claim 1, wherein the pseudo random device comprises a scrambler.

9. The local coil system as claimed in claim 8, wherein the scrambler comprises a self-synchronizing scrambler.

10. The local coil system as claimed in claim 1, wherein the pseudo random device comprises a grey counter.

11. The local coil system as claimed in claim 1, further comprising a delay device operable to delay at least one control signal, the delay device being activated by the pseudo random device to delay the at least one control signal in a pseudo random fashion.

12. The local coil system as claimed in claim 1, further comprising a space generator operable to generate spaces in a data stream, the space generator activated by the pseudo random device in order to generate pseudo random spaces in the data stream.

13. The local coil system as claimed in claim 2, further comprising a modulator operable to modulate an unmodulated signal into a modulated signal, where the transmitter transmits the modulated signal wirelessly to a receiver of the magnetic resonance system, and the pseudo random device includes a first scrambler operable to encode the unmodulated signal before being modulated by the modulator.

14. The local coil system as claimed in claim 13, further comprising an analog-to-digital converter operable to convert the MR response signals detected by the local coil into a digital signal, where the analog-to-digital converter comprises a second scrambler operable to pseudo randomly encode the digital signal before output by the analog-to-digital converter.

15. The local coil system as claimed in claim 14, wherein the transmitter comprises a carrier frequency generator coupled to the pseudo random device such that the pseudo random device varies a carrier frequency of a carrier frequency generator in a pseudo random fashion.

16. A magnetic resonance system comprising:
a local coil system comprising:
a local coil for detecting MR response signals;
at least one pseudo random device operable to change signals representing the detected MR response signals in a pseudo random fashion;
a transmitter operable to transmit signals based on the changed signals;
a receiver operable to receive the signals received from the transmitter; and
at least one descrambler operable to decode the received signals,
wherein the at least one pseudo random device is configured for chronologically delaying the signals representing the detected MR response signals pseudo-randomly.

17. The magnetic resonance system as claimed in claim 16, wherein the descrambler is operable to decode a signal encoded with a self-synchronizing scrambler.

18. A method comprising:
transmitting signals representing MR response signals from a transmitter of a local coil of a magnetic resonance system to a receiver of the magnetic resonance system;
changing the signals in a pseudo random fashion prior to transmission, the changing comprising chronologically delaying the signals pseudo-randomly; and
decoding the signals following the transmission.

* * * * *